United States Patent
Shizuno

(10) Patent No.: US 7,568,390 B2
(45) Date of Patent: Aug. 4, 2009

(54) SEMICONDUCTOR ACCELERATION SENSOR DEVICE AND METHOD FOR MANUFACTURING THE SAME

(75) Inventor: Yoshinori Shizuno, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 235 days.

(21) Appl. No.: 11/043,997

(22) Filed: Jan. 28, 2005

(65) Prior Publication Data

US 2005/0279166 A1    Dec. 22, 2005

(30) Foreign Application Priority Data

Jun. 18, 2004    (JP) .............................. 2004-181596

(51) Int. Cl.
 G01P 1/02    (2006.01)
 G01P 15/12    (2006.01)
(52) U.S. Cl. ...................................... 73/493; 73/514.33
(58) Field of Classification Search ................... 73/493, 73/514.33, 514.36, 514.38, 514.34, 514.29, 73/514.16, 514.01
See application file for complete search history.

(56) References Cited

U.S. PATENT DOCUMENTS

| | | | | |
|---|---|---|---|---|
| 4,933,744 A | * | 6/1990 | Segawa et al. .............. 257/795 |
| 5,507,182 A | * | 4/1996 | Yamada et al. ........... 73/514.33 |
| 5,783,750 A | * | 7/1998 | Otani ........................... 73/721 |
| 5,864,062 A | * | 1/1999 | Nagahara et al. ......... 73/514.01 |
| 5,866,818 A | * | 2/1999 | Sumi et al. ............... 73/514.33 |
| 5,948,991 A | * | 9/1999 | Nomura et al. ............... 73/727 |
| 6,049,120 A | * | 4/2000 | Otani et al. ................. 257/667 |
| 6,094,984 A | * | 8/2000 | Asano et al. .................. 73/493 |
| 6,201,285 B1 | * | 3/2001 | Iwata et al. ................ 257/419 |
| 6,316,840 B1 | * | 11/2001 | Otani ......................... 257/787 |
| 6,323,529 B1 | * | 11/2001 | Nagahara .................... 257/420 |
| 6,372,351 B1 | * | 4/2002 | Takemiya et al. ........... 428/416 |
| 6,435,028 B1 | * | 8/2002 | Nagahara ................. 73/514.01 |
| 6,979,873 B2 | * | 12/2005 | Fujii .......................... 257/417 |
| 7,100,448 B2 | * | 9/2006 | Ikegami ................... 73/514.33 |

FOREIGN PATENT DOCUMENTS

| | | |
|---|---|---|
| JP | 01-143963 | 6/1989 |
| JP | 07-225240 | 8/1995 |
| JP | 10-197374 | 7/1998 |

* cited by examiner

*Primary Examiner*—Helen C. Kwok
(74) *Attorney, Agent, or Firm*—Studebaker & Brackett PC; Donald R. Studebaker

(57) ABSTRACT

Although a weight part of an acceleration sensor chip fixed on a die pad is coated with a gelatinous resin part of low elasticity, the weight part is easily displaced by an external acceleration. Thus, an acceleration can be detected with accuracy. Furthermore, long-term reliability equal to those of regular resin packages is ensured because those portions of an acceleration sensor device which are not used for acceleration sensing are sealed with a resin part.

6 Claims, 7 Drawing Sheets

SEMICONDUCTOR ACCELERATION SENSOR DEVICE AND METHOD FOR MANUFACTURING THE SAME

BACKGROUND OF THE INVENTION

1. Field of the Invention

This invention relates to a semiconductor acceleration sensor device utilizing a resin sealed package and a method for manufacturing the device. More particularly, this invention relates to the device utilizing an MEMS (Micro Electro Mechanical Systems) or an MCP (Multi Chip Package). The MCP is a package on which an MEMS and a semiconductor circuit chip are mounted together.

2. Description of the Related Art

In recent years, with reduced sizes and thicknesses of electronic devices, attention is focused on an MEMS technology, which enables fabrication of sensors or electromechanical parts or the like in a micrometer size.

FIGS. 8A to 8C of attached drawings show cross-sectional views of examples of the constitution of semiconductor acceleration sensor devices utilizing a conventional MEMS package. FIG. 8A illustrates a single-chip type device, FIG. 8B a multi-chip type (a stacked type) device, and FIG. 8C a multi-chip type (a transversely-mounted type) device.

Generally, a hollow ceramic package is used for packaging a semiconductor acceleration sensor device. For example, in the single-chip type device shown in FIG. 8A, an acceleration sensor chip 10 is housed in a hollow ceramic package 20. The acceleration sensor chip 10 is formed based on a semiconductor fabrication process. A weight part 11 is formed through etching in the central area of the bulk portion of a silicon chip. Four beam parts 12 are formed in a cross shape to support the weight part 11 on a surface of the chip. A space 13 is formed between the weight part 11 and surrounding silicon. When the chip is subjected to an acceleration, the beam parts 12 are deformed. Piezoelectric elements formed on the beam parts 12 (not shown in the figure) detect stress, and thereby an acceleration is obtained (calculated). If the beam parts 12 are subject to a stress greater than an allowable value, the beam parts 12 are damaged due to a strain beyond a breaking limit. Therefore, stoppers are provided respectively above the beam parts 12 on the upper surface side of the acceleration sensor chip 10 and below the weight part 11 on the lower surface side of the acceleration sensor chip 10 to restrain displacement within a predetermined range.

The acceleration sensor chip 10 is fixed on a ceramic header 21 of the ceramic package 20. Wires 15, which are metal thin wires, connect electrode pads of the acceleration sensor chip 10 and post sections of the ceramic header 21. A ceramic cap 22 of the ceramic package 20 is fixed on the ceramic header 21, and covers the acceleration sensor chip 10.

The reason the hollow ceramic package 20 is used to package the acceleration sensor device is that the sensitivity and the repeatability of the device are increased when a space 23 within the ceramic cap 22 is kept under vacuum or filled with a gas so that the weight part 11 does not suffer from a drag when accelerated. When the space 13 is filled with an oil or a gel, as long as viscoelasticity characteristics thereof are stable, a drag acts on the weight part 11 can be cancelled out by tuning the characteristics of the oil or the gel.

A semiconductor pressure sensor device disclosed in Japanese Patent Kokai No. 10-170380 is known as an example of such a device as has a space within a semiconductor pressure sensor chip filled with an oil or a gel. In this semiconductor pressure sensor device, a surface of a semiconductor pressure sensor chip is coated with an elastic resin so that the semiconductor pressure sensor chip is protected from contaminants.

In the stacked type device shown in FIG. 8B, a semiconductor circuit chip 16 is fixed on a ceramic header 21. The semiconductor circuit chip 16 performs signal-processing of detection results of stress detected by the acceleration sensor chip 10 to generate a detection signal. Wires 17 connect electrode pads of the semiconductor circuit chip 16 and the post sections of the ceramic header 21. On the semiconductor circuit chip 16 is fixed the acceleration sensor chip 10. Wires 15 connect the electrode pads of the acceleration sensor chip 10 and the electrode pads of the semiconductor circuit chip 16.

In the transversely-mounted type device shown in FIG. 8C, the acceleration sensor chip 10 and the semiconductor circuit chip 16 are fixed on the ceramic header 21. The acceleration sensor chip 10 and the semiconductor circuit chip 16 are covered with the ceramic cap 22, and hermetically sealed.

The semiconductor acceleration sensor devices utilizing the conventional ceramic package 20 have problems (1) to (3) as follows:

(1) The manufacturing cost of the ceramic package 20 shown in FIGS. 8A to 8C becomes high because of the expensive parts used in manufacture. Furthermore, the ceramic header 21 and the ceramic cap 22 need to be hermetically sealed with low-melting-point glass or solder. The sealing requires high-temperature processing at a temperature of 360° C. or higher (400° C. or higher with respect to low-melting-point glass), which results in a change in the properties of the semiconductor circuit chip 16 which is packaged together with the acceleration sensor chip 10 as shown in FIGS. 8B and 8C.

(2) As to an MCP, in the stacked type device shown in FIG. 8B, when the acceleration sensor chip 10 is bonded on the semiconductor circuit chip 16 with organic material, the ceramic header 21 and the ceramic cap 22 also need to be resin sealed (bonded) for convenience of manufacturing processes. This resin sealing causes a problem in moisture resistance in a long term service life test. On the other hand, in the transversely-mounted type device shown in FIG. 8C, the package 20 becomes too large to have satisfactory package density.

(3) To solve the above problems (1) and (2), it is possible to seal the chip(s) with a resin in stead of the ceramic package 20, utilizing the technique of Japanese Patent Kokai No. 10-170380. As shown in FIG. 8C, a device disclosed in Japanese Patent Kokai No. 10-170380 mounts a pressure sensor chip and a semiconductor circuit chip transversely on a substrate. A resin package having an externally-exposed recess (i.e., a chip mounting part) is molded with the whole of the semiconductor circuit chip being resin sealed. The pressure sensor chip is fixed at the recess and kept exposed to the outside to detect external stress. In order to protect the pressure sensor chip from external contaminants, a surface of the pressure sensor chip is coated with an elastic protective resin which does not interfere with pressure transmission.

However, even though the whole of the semiconductor circuit chip 16 shown in FIG. 8C is resin sealed and the surface of the acceleration sensor chip 10 is coated with an elastic resin using the above technique of Japanese Patent Kokai No. 10-170380, there remains a problem of moisture resistance around the acceleration sensor chip 10. Thus, it is still difficult to overcome the problems (1) and (2).

SUMMARY OF THE INVENTION

One object of the present invention is to provide a semiconductor acceleration sensor device which is low-cost and excellent for mass production while maintaining long-term reliability, and also to provide a method for manufacturing such a semiconductor acceleration sensor device. The semiconductor acceleration sensor device is provided through giving low-cost resin packaging to an MEMS chip by filling the inside of the MEMS chip with a gel material and coating the MEMS chip with the gel material.

According to a first aspect of the present invention, there is provided a semiconductor acceleration sensor device that has an acceleration sensor chip, an elastic first resin part, and a second resin part. The acceleration sensor chip has a weight part, a support part, a pedestal part, and a stress detecting element. The support part flexibly supports the weight part with one end thereof connected to the weight part. The pedestal part surrounds the weight part with an opposite end of the support part connected thereto. The stress detecting element detects a stress from deformation caused in the support part due to an acceleration. The first resin part coats the weight part and the support part. The second resin part seals the first resin part and the acceleration sensor chip.

Although the weight part of the acceleration sensor chip is coated with the elastic first resin part, it is easily displaced by an external acceleration. Therefore, an acceleration can be detected with accuracy. Furthermore, long-term reliability equal to those of regular resin packages is ensured because those portions of the acceleration sensor device which are not used for acceleration sensing are sealed with the second resin part. Thus, compared to conventional devices, a device of lower-cost and higher mass productivity can be expected.

A method of manufacturing this semiconductor acceleration sensor device includes injecting the first resin part into the pedestal part to coat the support part and the weight part with the first resin part, and sealing the first resin part and the acceleration sensor chip with the second resin part.

According to this method, a semiconductor acceleration device which is excellent in long-term reliability can be mass-produced at a low cost through relatively simple process.

The semiconductor acceleration sensor device may further include a lid part attached to the acceleration sensor chip, a substrate having a conductive part extending outwardly from the second resin part, a semiconductor circuit chip electrically connected to the conductive part of the substrate and mounted on the substrate, and a bump provided on the semiconductor circuit chip and electrically connected to the acceleration sensor chip. The acceleration sensor chip is mounted on the bump. The acceleration sensor chip may be connected to the semiconductor circuit chip via the first resin part.

Reduction of a package size can be achieved by this semiconductor acceleration sensor device, since the acceleration sensor chip is arranged on the semiconductor circuit chip.

A method of manufacturing this semiconductor acceleration sensor device includes fixing the semiconductor circuit chip on the substrate, and electrically connecting the conductive part of the substrate to the semiconductor circuit chip; electrically connecting the stress detecting element to the bump by fixing the pedestal part on the bump provided on the semiconductor circuit chip; filling a gap between the pedestal part and the semiconductor circuit chip with the first resin part by injecting the first resin part into the pedestal part, and covering the support part and the weight part with the first resin part; and blocking (closing) the pedestal part with the lid part, and sealing the first resin part, the acceleration sensor chip, the lid part, and portions other than the conductive part of the substrate with the second resin part.

According to this manufacturing method, a semiconductor acceleration sensor device excellent in long-term reliability can be mass-produced at a lower cost through simpler manufacturing process.

The semiconductor acceleration sensor device may include a die pad and a through hole. The die pad has a first area and a second area, and also has an upper surface and a lower surface. The second area surrounds the first area. The pedestal part of the acceleration sensor chip is mounted on the second area. The through hole is formed from the upper surface of the first area of the die pad through the lower surface of the first area of the die pad.

A method of manufacturing this semiconductor acceleration sensor device includes fixing the pedestal part on the second area of the upper surface of the die pad; covering the support part and the weight part with the first resin part by injecting the first resin part into the pedestal part via the through hole of the die pad; and sealing the first resin part, the acceleration sensor chip, and the die pad with the second resin part.

BRIEF DESCRIPTION OF THE DRAWINGS

FIGS. 1A to 1F show the structure of a QFN (Quad Flat Nonlead) package type semiconductor acceleration sensor device according to a first embodiment of the present invention. Specifically, FIG. 1A is a cross-sectional view of the semiconductor acceleration sensor device. FIG. 1B is a perspective view of an acceleration sensor chip included in the semiconductor acceleration sensor device. FIG. 1C is a perspective view of a cross-sectional view taken along the line 1C-1C in FIG. 1B. FIG. 1D is a bisected perspective view of a cross-sectional view taken along the line 1D-1D in FIG. 1B. FIG. 1E is a plan view of the semiconductor acceleration sensor device shown in FIG. 1B. FIG. 1F is a cross-sectional view taken along the line 1F-1F in FIG. 1E.

DETAILED DESCRIPTION OF THE INVENTION

First Embodiment

Figure 1A:
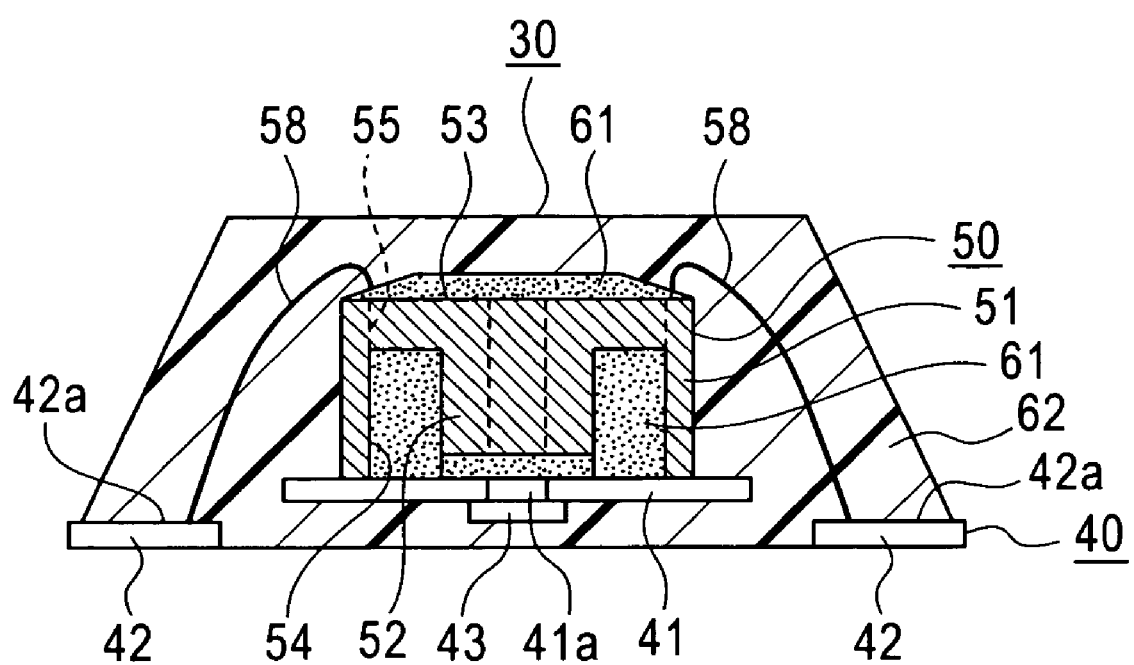
Figure 1D:
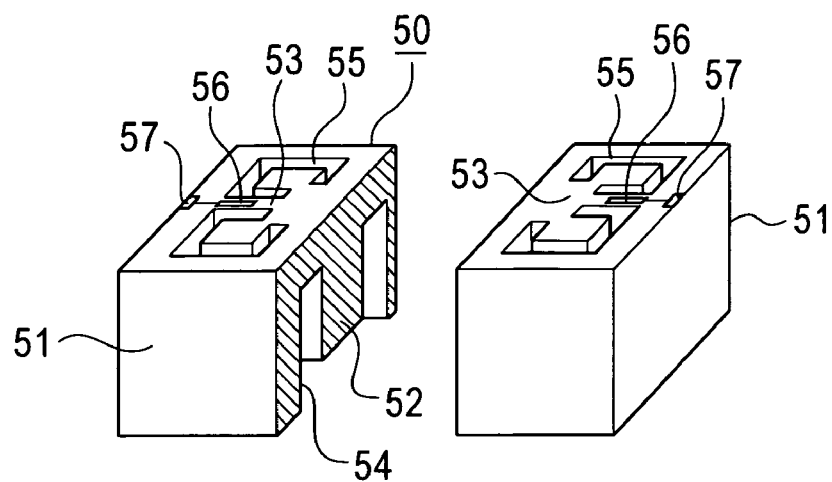
Figure 1E:
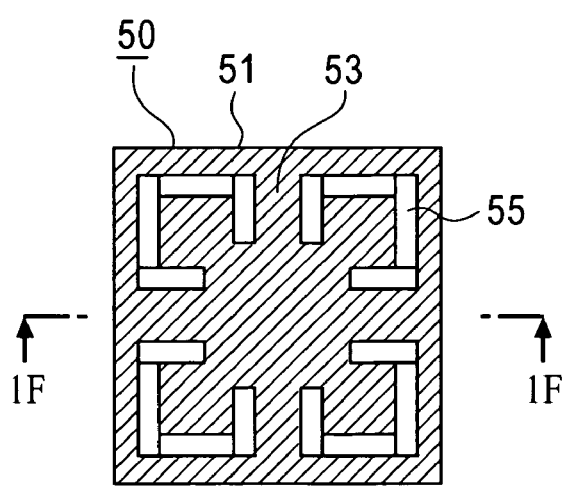
Figure 1F:
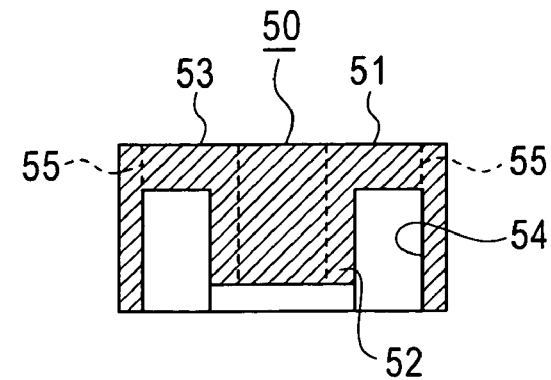

Referring to FIGS. 1A to 1F, a QFN package type semiconductor acceleration sensor device according to a first embodiment of the present invention will be described.

The semiconductor acceleration sensor device 30 is mounted on a lead frame 40. The lead frame 40 has a die pad 41 which is a rectangular supporting plate. In a first area of the die pad 41 which occupies the central portion of the die pad 41 is formed a first through hole 41a. Four conductive parts (for example, post sections) 42a of a plurality of leads 42 are provided around the die pad 41. On the lower surface of the die pad 41 is fixed a lid part 43 to close the through hole 41a. In a second area of the die pad 41, which surrounds the first area which occupies the central portion of the upper surface of the die pad 41 is fixed an acceleration sensor chip 50 which detects external acceleration.

The acceleration sensor chip 50 has a pedestal part (for example, a silicon chip or a semiconductor chip) 51. In the central area of the silicon chip 51 is formed a weight part 52 through etching based on a semiconductor fabrication process. In order to support the weight part 52, four support parts (for example, beam parts) 53 are formed on the upper surface of the silicon chip 51 in a cross shape. A space 54 is formed between the weight part 52 and surrounding silicon. The space 54 communicates with second through holes 55 formed on the upper surface of the silicon chip 51. On the respective four beam parts 53 are provided stress detecting elements (for example, piezo elements) 56. When the beam parts 53 are subjected to a stress due to an acceleration, the parts are deformed, and electric resistance of the piezo elements 56 is changed. From this change of the electric resistance, the piezo elements 56 detect the stress. These piezo elements 56 are electrically connected to a plurality of electrode pads 57 provided on the upper surface of the silicon chip 51. The electrode pads 57 are connected to the upper surfaces of the post sections 42a by wires 58. It should be noted that the post sections 42a has the lower surfaces (first surfaces) and the upper surfaces (second surfaces).

The space 54 of the acceleration sensor chip 50 is filled with a gelatinous first resin part 61. The beam parts 53 formed on the upper surface of the acceleration sensor chip 50 are also coated with the resin part 61. The gelatinous first resin part 61 is, for example, a silicon resin, which is at first a viscous liquid and then turns into a gelatinous resin by heating (roughly at 150° C.). (For example, the resin has an elastic modulus of approximately $1 \times 10^{-2}$ Mpa (=$1 \times 10^{-3}$ kg/mm$^2$) and a viscosity of approximately 2Pa·s.) The acceleration sensor chip 50, which is coated with the resin part 61, and connection points of the wires 58 are encapsulated in a thermosetting second resin part 62 such as an epoxy resin, a silicon resin, or a phenolic resin.

If the acceleration sensor chip 50 receives an acceleration greater than an allowable value, the beam parts 53 are destroyed due to a strain beyond a breaking limit. Therefore, it is preferable that stoppers are provided respectively above the beam parts 53 on the upper surface side of the acceleration sensor chip 50 and below the weight part 52 on the lower surface side of the acceleration sensor chip 50 to restrain displacement within a predetermined range. In the first embodiment, the upper surfaces of the beam parts 53 are coated with the resin part 62, which has turned into a solid state, with an intermediary of the gelatinous resin part 61 in between. Here, the resin part 62 serves as a stopper. Likewise, under the weight part 52 is provided the first area of the die pad 41, which also acts as a stopper. When the die pad 41 does not function well as a stopper due to the shortness of the weight part 52 in the vertical direction, a spacer having a through hole may be disposed beforehand on the die pad 41 so that the spacer functions as the stopper.

When the semiconductor acceleration sensor device receives an acceleration, the weight part 52 moves. Although the weight part 52 is coated with the gelatinous resin part 61, the weight part 52 is easily displaced, because the gelatinous resin part 61 has low elasticity (That is, the resin has high elasticity in a solid state and low elasticity in a liquid state.) and has low flow resistance against a force applied instantaneously, such as acceleration. (The viscosity of the resin part 61 has a great influence on a force applied at a low speed (e.g., pressure).) Therefore, the beam parts 53 which support the weight part 52 are deformed by the force of an external acceleration, and the electric resistance of the piezo elements 56 is changed. A stress acting on the beam parts 53 is thereby detected. The detected stress is supplied from the electrode pads 57 to the post sections 42a via the wires 58. The acceleration can be obtained accurately if the relationship between acceleration and displacement (stress) is stored beforehand in a semiconductor circuit or other device connected to the lower surfaces of the post sections 42a.

The first embodiment of the present invention has advantages (1) to (4) as follows:

(1) Although the weight part 52 and the beam parts 53 of the acceleration sensor chip 50 are coated with the gelatinous resin part 61 of low elasticity, they are easily displaced by an acceleration externally applied. Therefore, an acceleration can be detected with accuracy. Furthermore, long-term reliability equal to those of a regular resin packages is ensured because those portions of the acceleration sensor device which are not used for acceleration sensing are sealed with the resin part 62. Thus, compared to conventional acceleration sensor devices, a device of lower-cost and higher mass productivity can be expected.

(2) An acceleration sensor device can have a simple structure, since the resin part 62 above the acceleration sensor chip 50 and the die pad 41 below the acceleration sensor chip 50 restrain the vertical displacement of the weight part 52 and the beam parts 53, which eliminates the need for separately providing stoppers to restrain the vertical displacement. When the die pad 41 does not function well as a stopper due to the shortness of the weight part 52, a spacer having a through hole may be disposed beforehand on the die pad 41 so that the spacer functions as the stopper.

(3) By so controlling the viscosity of the gelatinous resin part 61 filling the space 54 that the resin part 61 will not leak into the through hole 41a in the die pad 41, it is possible to eliminate the need for providing the lid part 43. This can further simplify the structure of an acceleration sensor device.

(4) Although FIG. 1 illustrates a QFN package type device, the first embodiment of the present invention can be applied to resin packages in general.

Second Embodiment

FIGS. 2A to 2D show a series of manufacturing steps to fabricate the semiconductor acceleration sensor device 30 shown in FIG. 1.

The semiconductor acceleration sensor device 30 is manufactured, for example through the following steps (1) to (4).

Figure 2A:
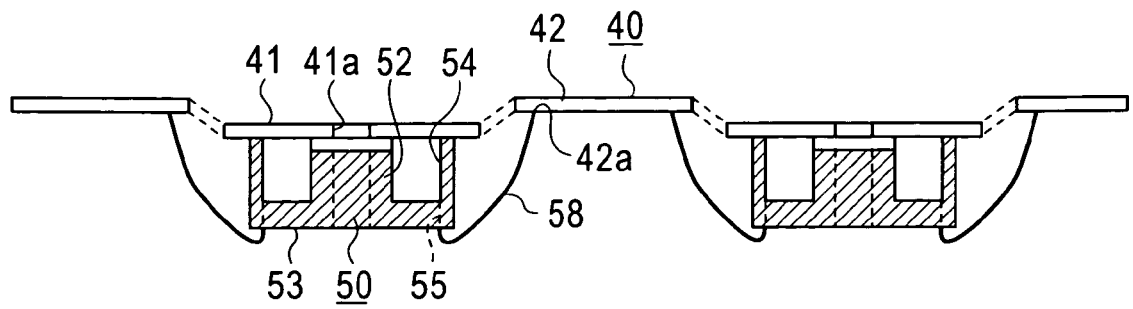
FIGS. 2A to 2D show a series of manufacturing steps according to a second embodiment to fabricate the semiconductor acceleration sensor device of FIG. 1.

(1) Step of FIG. 2A

The acceleration sensor chip 50 of FIG. 1 is prepared in advance. The acceleration sensor chip 50 is positioned on the die pad 41 of the lead frame 40. The die pad 41 is coupled to a plurality of other die pads 41 via the leads 42. The lower surface of the acceleration sensor chip 50 is die-bonded (fixed) on the upper surface of the die pad 41 with an adhesive or the like. When the die pad 41 does not function sufficiently as a stopper due to shortness of the weight part 52, a spacer having a through hole may be disposed beforehand on the die pad 41 so that the spacer serves as the stopper. After the electrode pads 57 on the upper surface of the acceleration sensor chip 50 are bonded (connected) to the respective post sections 42a of the lead frame 40 by the wires 58, the lead frame 40 is turned upside down as shown in FIG. 2A.

Figure 2B:
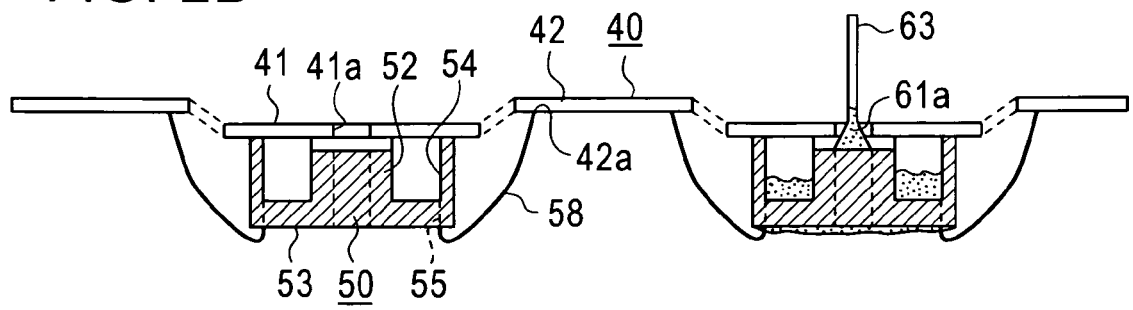

(2) Step of FIG. 2B

A needle 63 for resin injection is positioned over the through hole 41a provided in the center of the die pad 41. Then, from the needle 63 a viscous liquid resin (for example, such as a thermosetting silicon) 61a is injected into the through hole 41a. The resin 61a injected into the through hole 41a fills the space 54 of the acceleration sensor chip 50, and coats the beam parts 53 on the upper surface of the acceleration sensor chip 50 via the through holes 55.

Figure 2C:
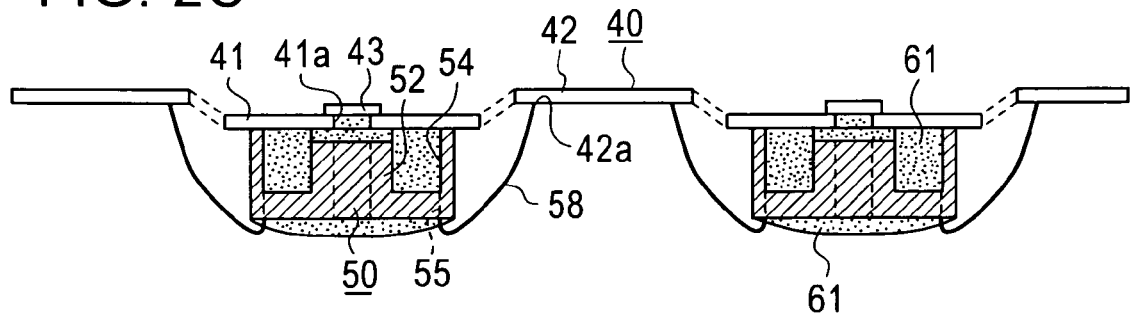

(3) Step of FIG. 2C

After the space 54 of the acceleration sensor chip 50 is filled with the resin 61a, and the beam parts 53 on the upper surface of the acceleration sensor chip 50 are coated with the resin 61a, the lid part 43 is fixed over the through hole 41a in the die pad 41. The liquid resin 61a is hardened into the gelatinous resin part 61 through heat treatment (for example, roughly at 150° C.).

Figure 2D:
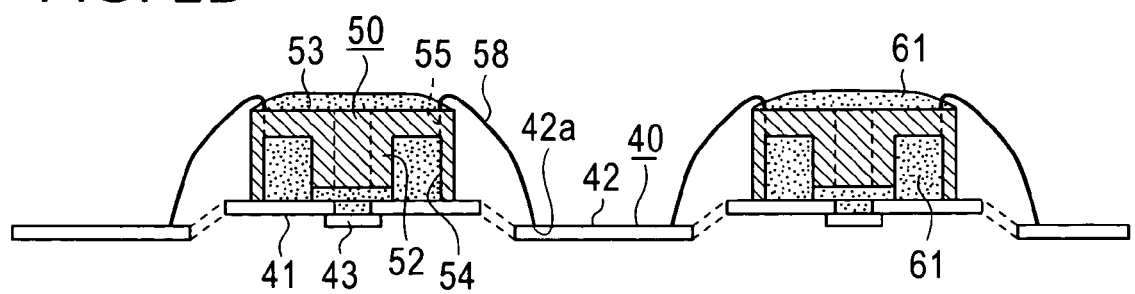

(4) Step of FIG. 2D

The lead frame 40 is again turned upside down to be back into the initial position. When the thickness of the resin part 61 covering the beam parts 53 on the upper surface of the acceleration sensor chip 50 is not enough, the liquid resin 61a is supplied from the upper surface of the acceleration sensor chip 50 as necessary. The liquid resin 61a is hardened into the gelatinous resin part 61 through heat treatment to complete formation of the coating on the beam part 53.

Subsequently, in the same manner as regular resin packages, the acceleration sensor chip 50 is encapsulated by the resin part 62 by such a method as transfer molding, and lead processing such as cutting of the leads 42 and surface treatment such as plating of the post sections 42a are performed. Accordingly, manufacture of the semiconductor acceleration sensor device 30 of FIG. 1 is completed.

The second embodiment of the present invention has advantages (1) to (3) as follows:

(1) The semiconductor acceleration sensor device 30, which is excellent in long-term reliability, can be mass-produced at a low cost through relatively simple process, since the acceleration sensor chip 50 is sealed with the resin part 62 after the weight part 52 and the beam parts 53 of the acceleration sensor chip 50 are covered with the gelatinous resin part 61.

(2) By so controlling the viscosity of the gelatinous resin part 61 filling the space 54 that the resin part 61 will not leak into the through hole 41a in the die pad 41, it is possible to eliminate the need for providing the lid part 43. This can further simplify the manufacturing process.

(3) Although a thermosetting silicon resin or the like is used as the viscous liquid resin 61a, a non-thermosetting silicon resin or the like may be employed. In this case, the non-thermosetting silicon resin is left standing for a predetermined period of time to harden into a gelatinous state instead of given heat treatment. A resin which is gelatinous from the start can also be employed as the resin 61a. In this case, it becomes difficult to fully coat the beam parts 53 on the upper surface of the acceleration sensor chip 50 with the resin injected via the through holes 55 when filling the space 54 of the acceleration sensor chip 50 in the step shown in FIG. 2B. Therefore, it is necessary to additionally supply the resin 61a from the upper surface of the acceleration sensor chip 50 in the step shown in FIG. 2C.

Third Embodiment

FIGS. 3A to 3D show another series of manufacturing steps to fabricate the semiconductor acceleration sensor device 30 shown in FIG. 1. This method is similar to that of the second embodiment. The semiconductor acceleration sensor device 30 is manufactured, for example, through the following steps (1) to (4).

Figure 3A:
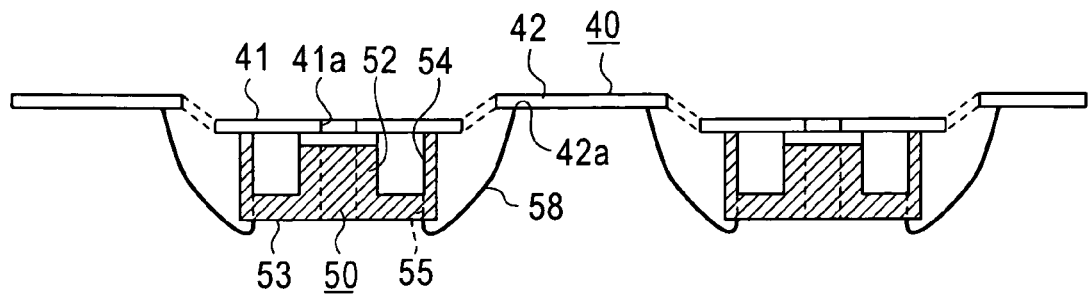
FIGS. 3A to 3D show another series of manufacturing steps according to a third embodiment to fabricate the semiconductor acceleration sensor device of FIG. 1.

(1) Step of FIG. 3A

In the same manner as shown in FIG. 2A, the acceleration sensor chip 50 is die-bonded on the die pad 41 of the lead frame 40. After the electrode pads 57 of the acceleration sensor chip 50 are bonded to the post sections 42a of the lead frame 40 by the wires 58, the lead frame 40 is turned upside down as shown in FIG. 3A.

Figure 3B:
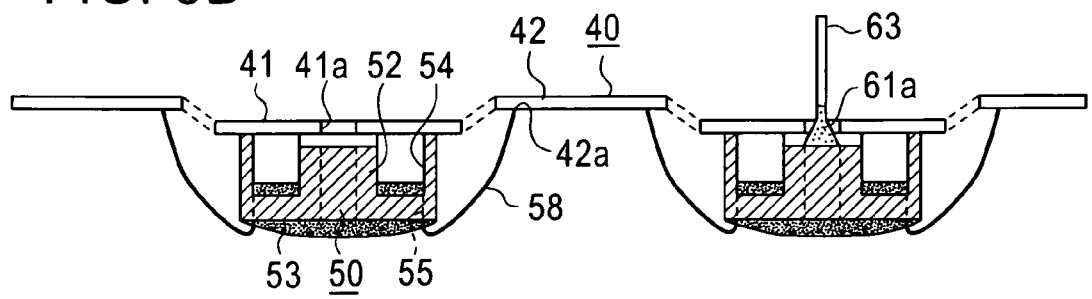

(2) Step of FIG. 3B

The needle 63 for resin injection is positioned over the through hole 41a provided in the center of the die pad 41. Then, from the needle 63 the viscous liquid resin (for example, such as a thermosetting silicon resin) 61a is injected into the through hole 41a by only enough amount to coat the upper surface of the acceleration sensor chip 50. The resin 61a injected into the through hole 41a flows via the through holes 55 of the acceleration sensor chip 50 to cover the beam parts 53 on the upper surface of the acceleration sensor chip 50. Then, the resin 61a covering the beam part 53 is turned into a gelatinous state through heat treatment (for example, roughly at 150° C.).

Figure 3C:
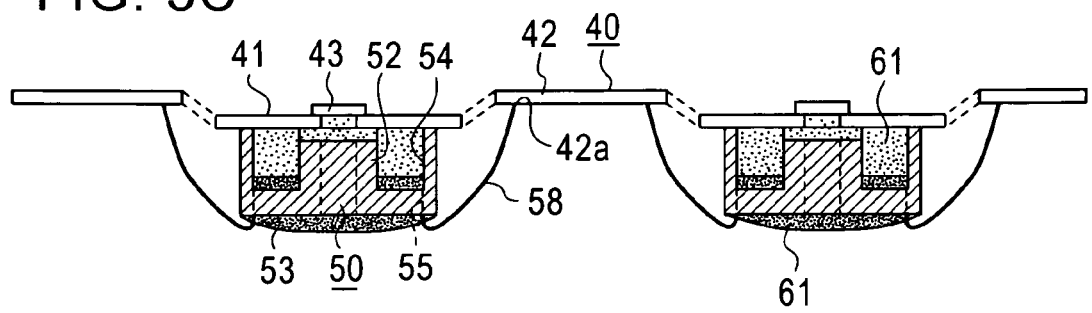

(3) Step of FIG. 3C

Once again, the liquid resin 61a is injected from the through hole 41a in the die pad 41 to fill the space 54 of the acceleration sensor chip 50. Subsequently, the lid part 43 is fixed over the through hole 41a in the die pad 41. The resin 61a within the space 54 is turned into a gelatinous state through heat treatment (for example, roughly at 150° C.). Thus, the weight part 52 and the beam parts 53 of the acceleration sensor chip 50 are coated with the gelatinous resin part 61.

Figure 3D:
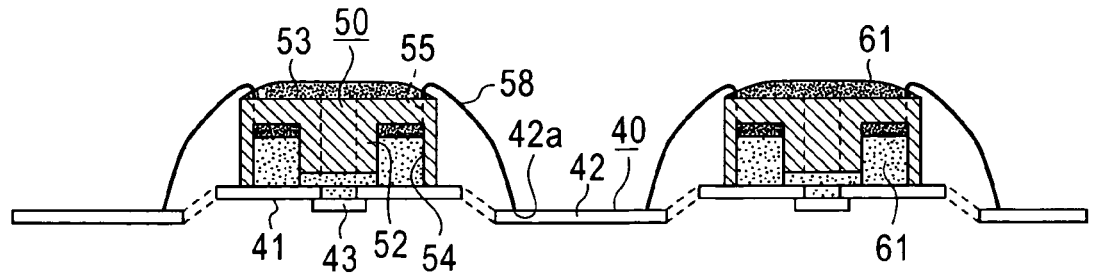

(4) Step of FIG. 3D

After the lead frame 40 is turned upside down to be back into the initial position, in the same manner as regular resin packages, the acceleration sensor chip 50 is encapsulated by the resin part 62 by such a method as transfer molding, and lead processing such as cutting of the leads 42 and surface treatment such as plating of the post sections 42a are performed. Accordingly, manufacture of the semiconductor acceleration sensor device 30 of FIG. 1 is completed.

The third embodiment of the present invention has advantages (1) and (2) as follows:

(1) Injection of the resin 61a is performed in two steps. In a first step, the beam parts 53 of the acceleration sensor chip 50 is coated with the gelatinous resin part 61. In a second step, the weight part 52 is covered with the gelatinous resin part 61. Therefore, injection of the resin 61a in the first step and in the second step can be performed continuously with the lead frame 40 turned upside down. Thus, formation of coating with the resin part 61 can be conducted with efficiency, (2) By so controlling the viscosity of the gelatinous resin part 61 filling the space 54 that the resin part 61 will not leak into the through hole 41a in the die pad 41, it is possible to eliminate the need for providing the lid part 43. This can further simplify the manufacturing process. This advantage is similar to that of the second embodiment.

Fourth Embodiment

Figure 4:
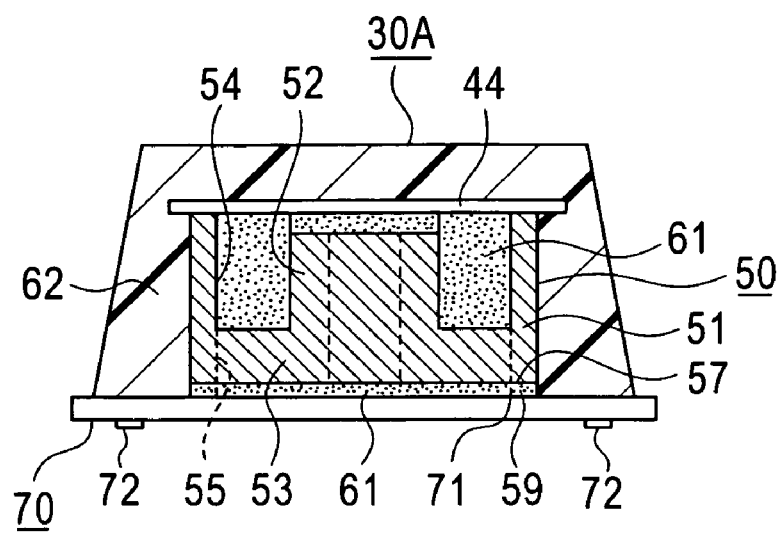
FIG. 4 is a cross-sectional view of an SON package type semiconductor acceleration sensor device according to a fourth embodiment of the present invention.

FIG. 4 is a cross-sectional view of an SON (Small Outline Nonlead) package type semiconductor acceleration sensor device according to a fourth embodiment of the present invention. Structural elements common to those of the first embodiment shown in FIG. 1 are designated by the same or similar reference symbols.

A semiconductor acceleration sensor device 30A is mounted on a substrate (for example, a wiring board) 70. The wiring board 70 has a plurality of post sections 71 on the upper surface, and a plurality of conductive parts 72 on the lower surface. The post sections 71 and the conductive parts 72 are connected by through holes or the like which are not shown in the figure. On the post sections 71 of the wiring board 70 is flip-chip bonded an acceleration sensor chip 50 similar to that shown in FIG. 1. On a plurality of electrode pads 57 provided on the upper surface of the acceleration sensor chip 50 are respectively formed bumps 59, which are electrically connected to the electrode pads 57. These bumps 59 are bonded on the post sections 71 of the wiring board 70, thus electrically and mechanically connecting the acceleration sensor chip 50 to the wiring board 70.

The space 54 within the acceleration sensor chip 50 is filled with the resin part 61 such as a gelatinous silicon resin, and a gap between the upper surface of the acceleration sensor chip 50 and the upper surface of the wiring board 70 is also filled with the gelatinous resin part 61. On the lower surface of the acceleration sensor chip 50 is fixed a lid part 44. The lid part 44 blocks the space 54. The acceleration sensor chip 50 is encapsulated in the thermosetting resin part 62 such as an epoxy resin, a silicon resin, or a phenolic resin.

In the fourth embodiment, the wiring board 70 functions as a lower stopper against beam parts 53 on the upper surface of the acceleration sensor chip 50, and the lid part 44 serves as an upper stopper against the weight part 52 of acceleration sensor chip 50. When the lid part 44 does not work well as a stopper due to the shortness of the weight part 52 in the vertical direction, a protrusion may be formed by a drawing process or the like in the central portion of the lid part 44, so that the protrusion extends into the acceleration sensor chip 50. Alternatively, a spacer may be attached to the upper surface of the lid part 44 (the surface which is fixed to the acceleration sensor chip 50) so that the spacer functions as the stopper.

The semiconductor acceleration sensor device 30A having the above-described structure operates in almost the same manner as the device of the first embodiment. When the device receives an external acceleration, the weight part 52 moves. Because of low elasticity of the gelatinous resin part 61 around the weight part 52, the weight part 52 is easily displaced. The piezo elements 56 on the beam parts 53 detect the displacement. Results detected by the piezo elements 56 are transmitted to the post sections 71 of the wiring board 70 via the electrode pads 57 and the bumps 59, and issued from the conductive parts 72. The acceleration can be obtained accurately if the relationship between acceleration and displacement (stress) is stored in advance in a semiconductor circuit or other device connected to the wiring board 70.

The semiconductor acceleration sensor device 30A of the fourth embodiment is manufactured, for example, through the following steps (a) to (c).

(a) First Step

The upper surface of the acceleration sensor chip 50, which is prepared beforehand, is positioned over the post sections 71 provided on the wiring board 70. The bumps 59 formed on the upper surface of the acceleration sensor chip 50 are flip-chip bonded on the post sections 71 of the wiring board 70.

(b) Second Step

A viscous liquid resin (for example, such as a thermosetting silicon resin) 61a is injected into the space 54 of the acceleration sensor chip 50. The resin 61a fills up the gap between the upper surface of the acceleration sensor chip 50 and the upper surface of the wiring board 70 via the through holes 55 to coat the beam parts 53, and the resin 61a also fills up the space 54. Subsequently, the lid part 44 is fixed on the lower surface of the acceleration sensor chip 50 to block the space 54. The liquid resin 61a is hardened into the gelatinous resin part 61 through heat treatment (for example, roughly at 150° C.).

(c) Third Step

In the same manner as regular resin packages, the acceleration sensor chip 50 is encapsulated in the resin part 62 by such a method as transfer molding and manufacture of the semiconductor acceleration sensor device 30A of FIG. 4 is completed.

The fourth embodiment of the present invention has advantages (1) to (5) as follows:

(1) Similar to the first embodiment, although the weight part 52 of the acceleration sensor chip 50 is coated with the gelatinous resin part 61 of low elasticity, it is easily displaced by an external acceleration. Therefore, an acceleration can be detected with accuracy. Furthermore, long-term reliability equal to those of regular resin packages is ensured because those portions of the acceleration sensor device which are not used for acceleration sensing are sealed with the resin part 62.

(2) An acceleration sensor device of simple structure can be obtained, since the lid part 44 on the acceleration sensor chip 50 and the wiring board 70 below the acceleration sensor chip 50 restrain the vertical displacement of the weight part 52 and the beam parts 53, which eliminates the need for separately providing stoppers to restrain the vertical displacement. When the lid part 44 does not function well as a stopper due to the shortness of the weight part 52, a protrusion may be formed in the central portion of the lid part 44, so that the protrusion extends into the acceleration sensor chip 50. Alternatively, a spacer may be attached to the upper surface of the lid part 44 (the surface which is fixed to the acceleration sensor chip 50) so that the spacer serves as the stopper.

(3) The semiconductor acceleration sensor device 30A is manufactured through the following sequence; first, the acceleration sensor chip 50 is flip-chip bonded on the wiring board 70; then, the space 54 within the acceleration sensor chip 50, and the gap between the upper surface of the acceleration sensor chip 50 and the upper surface of the wiring board 70 are filled with the gelatinous resin part 61; after that, the acceleration sensor chip 50 is sealed with the resin part 62. Therefore, compared to the device of the first embodiment, package size can be reduced. Manufacturing process can also be further simplified. Thus, the semiconductor acceleration sensor device 30A excellent in long-term reliability can be mass-produced at a lower cost.

(4) Alternatively, manufacturing steps similar to those of FIGS. 3B and 3C may be employed to manufacture the semiconductor acceleration sensor device 30A shown in FIG. 4. In that case, injection of the liquid resin 61a is performed in two steps. In a first step, the gap between the upper surface of the acceleration sensor chip 50 and the upper surface of the wiring board 70 is filled with the resin 61*a*, and then the resin 61*a* is turned into the gelatinous resin part 61 through heat treatment. In a second step, the space 54 is filled with the liquid resin 61*a*, and the liquid resin 61*a* is then turned into the gelatinous resin part 61 through heat treatment.

(5) Although FIG. 4 illustrates an SON package type device, the fourth embodiment of the present invention can be applied to resin packages in general.

Fifth Embodiment

Figure 5:
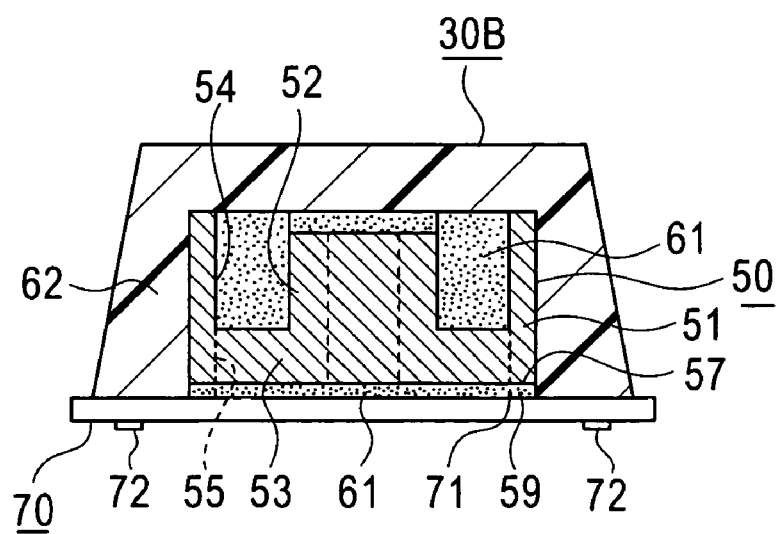
FIG. 5 is a cross-sectional view of another SON package type semiconductor acceleration sensor device according to a fifth embodiment of the present invention.

FIG. 5 is a cross-sectional view of another SON package type semiconductor acceleration sensor device 30B according to a fifth embodiment of the present invention. Structural elements common to those of the fourth embodiment shown in FIG. 4 are designated by the same or similar reference symbols.

The semiconductor acceleration sensor device 30B does not need the lid part 44, since the viscosity characteristics of the gelatinous resin part 61 of FIG. 4 is controlled (i.e., the viscosity is changed). The semiconductor acceleration sensor device 30B is the same as the semiconductor acceleration sensor device 30A of the fourth embodiment of FIG. 4 except for the lid part 44.

The semiconductor acceleration sensor device 30B having the above-described structure operates in almost the same manner as the semiconductor acceleration sensor device of the fourth embodiment. When the semiconductor acceleration sensor device is externally accelerated, the weight part 52 moves. Because of low elasticity of the gelatinous resin part 61 around the weight part 52, the weight part 52 is easily displaced. The piezo elements 56 on the beam parts 53 detect the displacement. When the weight part 52 is displaced toward the lower surface of the acceleration sensor chip 50 (to the upward direction in FIG. 5) due to the acceleration, the solid-state resin part 62, working as a stopper, prevents the acceleration sensor chip 50 from being damaged.

The semiconductor acceleration sensor device 30B of the fifth embodiment is manufactured, for example, through the following steps (a) to (c).

(a) First Step

The acceleration sensor chip 50 is positioned over the post sections 71 on the wiring board 70. The bumps 59 formed on the upper surface of the acceleration sensor chip 50 are flip-chip bonded on the post sections 71 of the wiring board 70.

(b) Second Step

The viscous liquid resin (for example, such as a thermosetting silicon resin having a relatively large viscosity) 61*a* is injected into the space 54 of the acceleration sensor chip 50. The resin 61*a* fills up the gap between the upper surface of the acceleration sensor chip 50 and the upper surface of the wiring board 70 via the through hole 55 to coat the beam parts 53, and the resin 61*a* also fills up the space 54. Subsequently, the liquid resin 61*a* is hardened into the gelatinous resin part 61 through heat treatment (for example, roughly at 150° C.).

(c) Third Step

In the same manner as regular resin packages, the acceleration sensor chip 50 is encapsulated in the resin part 62 by such a method as transfer molding. The manufacture of the semiconductor acceleration sensor device 30B of FIG. 5 is thus completed.

The fifth embodiment of the present invention has advantages (i) and (ii), in addition to almost the same advantages as (1), and (3) to (5) of the fourth embodiment:

(i) The viscosity characteristics of the gelatinous resin part 61 is controlled (i.e., the viscosity is changed) so that the resin part 61 does not leak into an area surrounding the acceleration sensor chip 50, thereby eliminating the need for the lid part 44. This further simplifies the structure of the acceleration sensor device and manufacturing process thereof compared to the fourth embodiment. Therefore, the semiconductor acceleration sensor device 30B can be provided at a lower cost.

(ii) The resin part 62 above the acceleration sensor chip 50 and the wiring board 70 below the acceleration sensor chip 50 restrain the vertical displacement of the weight part 52 and the beam parts 53, which eliminates the need for separately providing stoppers to restrain the vertical displacement. Thus, an acceleration sensor device can have a simpler structure.

Sixth Embodiment

Figure 6:
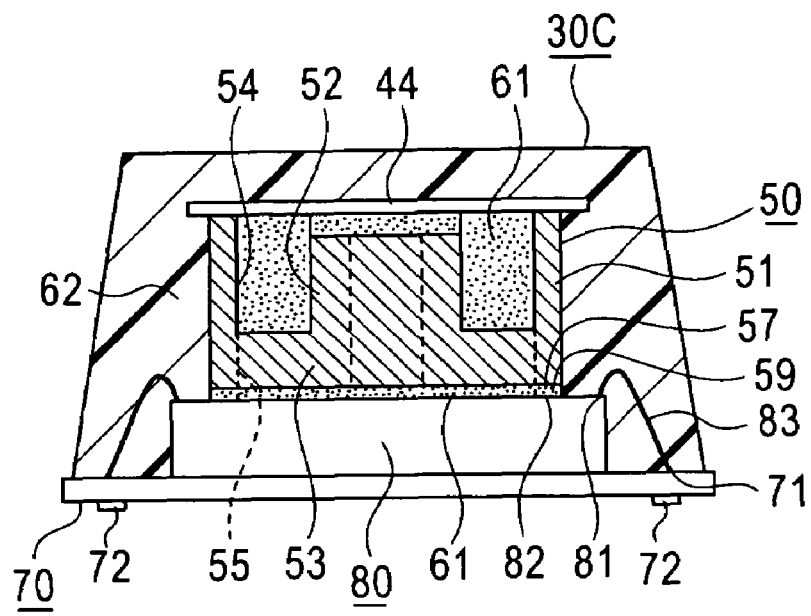
FIG. 6 is a cross-sectional view of an MCP type semiconductor acceleration sensor device according to a sixth embodiment of the present invention.

FIG. 6 is a cross-sectional view of an MCP type semiconductor acceleration sensor device 30C according to a sixth embodiment of the present invention. Structural elements common to those of the fourth embodiment shown in FIG. 4 are denoted with the same or similar symbols.

The semiconductor acceleration sensor device 30C is an MCP type device which has a semiconductor circuit chip 80, for example, within the semiconductor acceleration sensor device 30A shown in FIG. 4. The semiconductor circuit chip 80 is stacked on the semiconductor acceleration sensor chip 50, and the acceleration sensor chip 50 and the semiconductor circuit chip 80 are sealed with a resin. The semiconductor circuit chip 80 performs signal-processing of stress detected by the acceleration sensor chip 50, and generates a detection signal.

The semiconductor circuit chip 80 is die-bonded on the upper surface of the wiring board 70. The wiring board 70 has the post sections 71 on the upper surface thereof and the conductive parts 72 on the lower surface thereof. On a perimeter of the upper surface of the semiconductor circuit chip 80 are provided a plurality of electrode pads 81. Inside the electrode pads 81 are disposed a plurality of mounting pads 82. The electrode pads 81 are bonded to the post sections 71 of the wiring board 70 by wires 83. On the mounting pads 82 is flip-chip bonded an acceleration sensor chip 50 similar to that of FIG. 4. On the electrode pads 57 provided on the upper surface of the acceleration sensor chip 50 are formed the bumps 59. The bumps 59 are electrically connected to the electrode pads 57. These bumps 59 are bonded on the mounting pads 82 of the semiconductor circuit chip 80, thus electrically and mechanically connecting the acceleration sensor chip 50 to the semiconductor circuit chip 80.

The space 54 of the acceleration sensor chip 50 is filled with the resin part 61 such as a gelatinous silicon resin. A gap between the upper surface of the acceleration sensor chip 50 and the upper surface of the semiconductor circuit chip 80 is also filled with the gelatinous resin part 61. On the lower surface of the acceleration sensor chip 50 is fixed the lid part 44. The lid part 44 blocks the space 54. The acceleration sensor chip 50 and the semiconductor circuit chip 80 are encapsulated in the thermosetting second resin part 62 such as an epoxy resin, a silicon resin, or a phenolic resin.

In the sixth embodiment, the upper surface of the semiconductor circuit chip 80 functions as a lower stopper against the beam parts 53 provided on the upper surface of the acceleration sensor chip 50, and the lid part 44 serves as an upper stopper against the weight part 52 of the acceleration sensor chip 50. When the lid part 44 does not serve sufficiently as a stopper due to the short vertical length of the weight part 52, a protrusion may be formed by a drawing process or the like in the central portion of the lid part 44, so that the protrusion extends into the acceleration sensor chip 50, or a spacer may be attached to the upper surface of the lid part 44 (the surface which is fixed to the acceleration sensor chip 50) so that the spacer serves as the stopper.

When the semiconductor acceleration sensor device 30C receives an acceleration, the weight part 52 moves. Because of low elasticity of the gelatinous resin part 61 around the weight part 52, the weight part 52 is easily displaced. Piezo elements 56 on the beam parts 53 detect the displacement. Detected results are supplied to the mounting pads 82 on the semiconductor circuit chip 80 via the electrode pads 57 and the bumps 59. In the semiconductor circuit chip 80 is stored in advance the relationship between acceleration and displacement (stress). The semiconductor circuit chip 80 processes the detected results to generate an acceleration detection signal. The acceleration detection signal is transmitted to the post sections 71 of the wiring board 70 via the electrode pads 81 and the wires 83 and issued from the conductive parts 72.

The semiconductor acceleration sensor device 30C of the sixth embodiment is manufactured, for example, through the following steps (a) to (d).

(a) First Step

The lower surface of the semiconductor circuit chip 80, which is prepared beforehand, is positioned and die-bonded on the wiring board 70. The electrode pads 81 formed on the upper surface of the semiconductor circuit chip 80 are bonded to the post sections 71 formed on the upper surface of the wiring board 70 by the wires 83.

(b) Second Step

The upper surface of the acceleration sensor chip 50, which is prepared beforehand, is positioned over the mounting pads 82 formed on the upper surface of the semiconductor circuit chip 80. The bumps 59 formed on the electrode pads 57 on the upper surface of the acceleration sensor chip 50 are flip-chip bonded on the mounting pads 82 on the semiconductor circuit chip 80. It should be noted that the wire-bonding by the wires 83 in the first step may be conducted after the bumps 59 are flip-chip bonded on the mounting pads 82.

(c) Third Step

The viscous liquid resin (for example, such as a thermosetting silicon resin) 61a is injected into the space 54 of the acceleration sensor chip 50. The resin 61a fills up the gap between the upper surface of the acceleration sensor chip 50 and the upper surface of the semiconductor circuit chip 80 via the through hole 55 to coat the beam parts 53, and the resin 61a also fills up the space 54. Subsequently, the lid part 44 is fixed on the lower surface of the acceleration sensor chip 50 to block the space 54. The liquid resin 61a is hardened into the gelatinous resin part 61 through heat treatment (for example, roughly at 150° C.).

(c) Fourth Step

In the same manner as regular resin packages, the acceleration sensor chip 50 and the semiconductor circuit chip 80 are encapsulated in the resin part 62 by such a method as transfer molding. The manufacture of the semiconductor acceleration sensor device 30C of FIG. 6 is thus completed.

The sixth embodiment of the present invention has advantages (i) and (ii), in addition to almost the same advantages as (1), (2) and (5) of the fourth embodiment:

(i) An MCP which includes the acceleration sensor chip 50 and the semiconductor circuit chip 80 is manufactured through the following sequence; first, the acceleration sensor chip 50 is flip-chip bonded on the semiconductor circuit chip 80 which is fixed on the wiring board 70; then, the space 54 within the acceleration sensor chip 50, and the gap between the upper surface of the acceleration sensor chip 50 and the upper surface of the semiconductor circuit chip 80 are filled with the gelatinous resin part 61; after that, the acceleration sensor chip 50 and the semiconductor circuit chip 80 are sealed with the resin part 62. Therefore, such an MPC can be provided at a low cost and in a low-temperature process.

(ii) Manufacturing steps similar to those of FIGS. 3B and 3C may be employed to manufacture the acceleration sensor device 30C of FIG. 6. In that case, injection of the liquid resin 61a is performed in two steps. In a first step, the gap between the upper surface of the acceleration sensor chip 50 and the upper surface of the semiconductor circuit chip 80 is filled with the resin 61a, and then the resin 61a is turned into the gelatinous resin part 61 through heat treatment. In a second step, the space 54 is filled with the liquid resin 61a, and the liquid resin 61a is then turned into the gelatinous resin part 61 through heat treatment.

Seventh Embodiment

Figure 7:
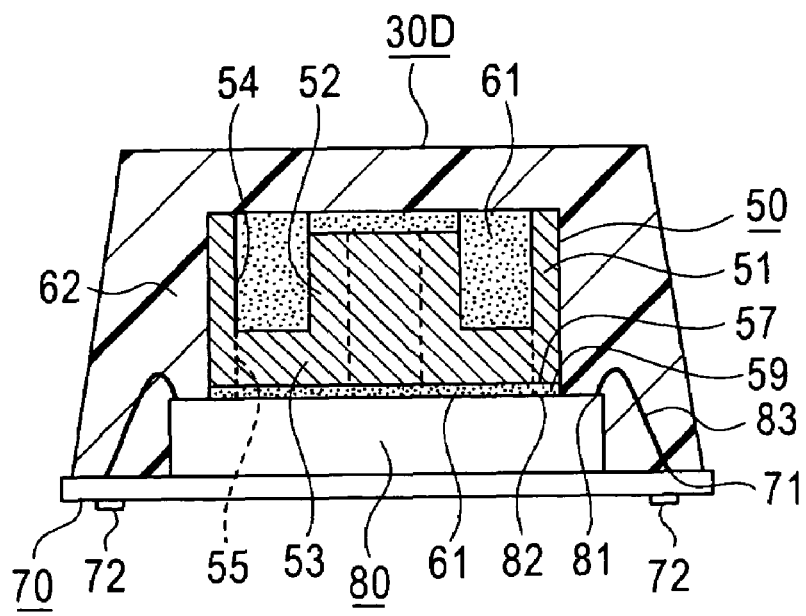
FIG. 7 is a cross-sectional view of another MCP type semiconductor acceleration sensor device according to a seventh embodiment of the present invention.
Figure 8A:
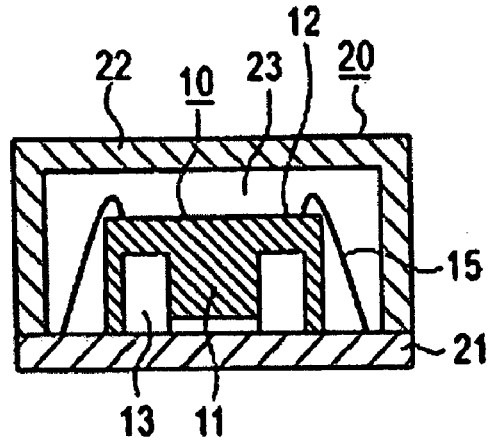
FIGS. 8A to 8C show cross-sectional views of semiconductor acceleration sensor devices utilizing a conventional MEMS package respectively.
Figure 8B:
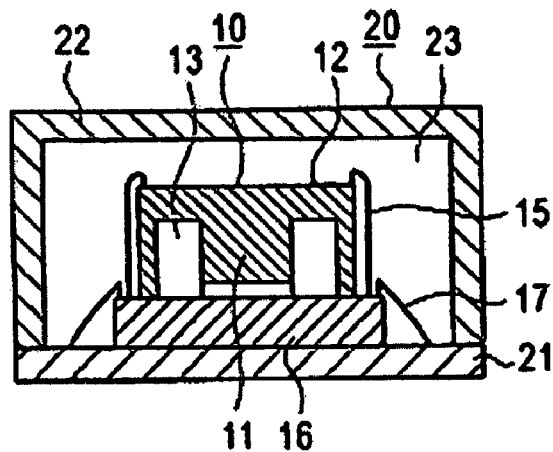
Figure 8C:
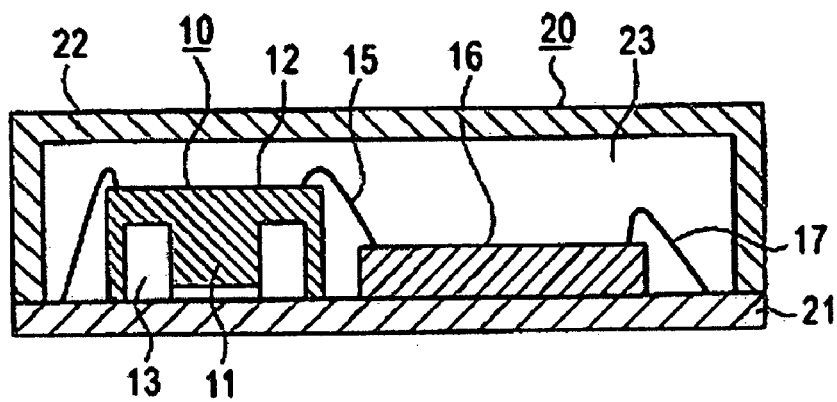

FIG. 7 is a cross-sectional view of an MCP type semiconductor acceleration sensor device 30D according to a seventh embodiment of the present invention. Structural elements common to those of the sixth embodiment shown in FIG. 6 are denoted by the same or similar symbols.

The semiconductor acceleration sensor device 30D does not have the lid part 44, since the viscosity characteristics of the gelatinous resin part 61 of FIG. 6 is controlled (i.e., the viscosity is changed). The semiconductor acceleration sensor device 30D is the same as the semiconductor acceleration sensor device of the sixth embodiment of FIG. 6 except for the lid part 44.

The semiconductor acceleration sensor device 30D having the above-described structure operates in almost the same manner as the semiconductor acceleration sensor device of the sixth embodiment. When the semiconductor acceleration sensor device is externally accelerated, the weight part 52 moves. Because of low elasticity of the gelatinous resin part 61 around the weight part 52, the weight part 52 is easily displaced. The piezo elements 56 on the beam parts 53 detect the displacement. Based on the detected results, the semiconductor circuit chip 80 generates an acceleration detection signal. The acceleration detection signal is transmitted to the post sections 71 of the wiring board 70 and issued from the conductive parts 72. When the weight part 52 is displaced toward the lower surface of the acceleration sensor chip 50 (to the upward direction in the FIG. 7) due to the acceleration, the solid-state resin part 62, serving as a stopper, prevents the acceleration sensor chip 50 from being damaged.

The semiconductor acceleration sensor device 30D of the seventh embodiment is manufactured, for example, through the following steps (a) to (d).

(a) First Step

The lower surface of the semiconductor circuit chip 80 is positioned and die-bonded on the wiring board 70. The electrode pads 81 on the upper surface of the semiconductor circuit chip 80 are bonded to the post sections 71 on the upper surface of the wiring board 70 by the wires 83.

(b) Second Step

The upper surface of the acceleration sensor chip 50 is positioned over the mounting pads 82 formed on the upper surface of the semiconductor circuit chip 80. The bumps 59 respectively formed on the electrode pads 57 on the upper surface of the acceleration sensor chip 50 are flip-chip bonded on the mounting pads 82 on the semiconductor circuit chip 80. It should be noted that the wire-bonding by the wires 83 in the first step may be conducted after the bumps 59 are flip-chip bonded on the mounting pads 82.

(c) Third Step

The viscous liquid resin (for example, such as a thermosetting silicon resin) 61a is injected into the space 54 of the acceleration sensor chip 50. The resin 61a fills up the gap between the upper surface of the acceleration sensor chip 50 and the upper surface of the semiconductor circuit chip 80 via the through hole 55 to coat the beam parts 53, and the resin 61a also fills up the space 54. Subsequently, the liquid resin 61a is hardened into the gelatinous resin part 61 through heat treatment (for example, roughly at 150° C.).

(c) Fourth Step

In the same manner as regular resin packages, the acceleration sensor chip 50 and the semiconductor circuit chip 80 are encapsulated in the resin part 62 by such a method as transfer molding, and manufacture of the semiconductor acceleration sensor device 30D of FIG. 7 is completed.

The seventh embodiment of the present invention has advantages (I) and (II), in addition to the same advantages as (1), (2) and (5) of the fourth embodiment, and almost the same advantage as (i) of the sixth embodiment:

(I) The fifth embodiment of the present invention has advantages (i) and (ii), in addition to almost the same advantages as (1), and (3) to (5) of the fourth embodiment:

(i) The viscosity characteristics of the gelatinous resin part 61 is controlled (i.e., the viscosity is changed) so that the resin part 61 does not leak into an area surrounding the acceleration sensor chip 50, thereby eliminating the need for the lid part 44. This further simplifies the structure of the acceleration sensor device and manufacturing process thereof compared to the sixth embodiment. Therefore, the semiconductor acceleration sensor device 30B can be provided at a lower cost.

(II) Manufacturing steps similar to those of FIGS. 3B and 3C may be employed to manufacture the acceleration sensor device 30D of FIG. 7. In that case, injection of the liquid resin 61a is performed in two steps. In a first step, the gap between the upper surface of the acceleration sensor chip 50 and the upper surface of the semiconductor circuit chip 80 is filled with the resin 61a, and then the resin 61a is turned into the gelatinous resin part 61 through heat treatment. In a second step, the space 54 is filled with the liquid resin 61a, and the liquid resin 61a is then turned into the gelatinous resin part 61 through heat treatment.

Although the present invention has been described in connection with a semiconductor acceleration sensor device and a method for manufacturing the device, it should be noted that the invention can also be applied to various semiconductor sensor devices on which a sensor chip other than an acceleration sensor chip is mounted.

This application is based on Japanese Patent Application No. 2004-181596 filed on Jun. 18, 2004, and the entire disclosure thereof is incorporated herein by reference.

What is claimed is:

1. A semiconductor acceleration sensor device comprising:
    an acceleration sensor chip including:
        a weight part,
        a support part which flexibly supports the weight part, one end of the support part being connected to the weight part,
        a pedestal part surrounding the weight part, an opposite end of the support part being connected to the pedestal part,
        a stress detecting element which detects a stress from deformation caused in the support part due to an acceleration, the stress detecting element being attached to or buried in the support part;
    an elastic first resin part to coat and to entirely cover the weight part and the support part;
    a second resin pan to encapsulate the first resin pan and the acceleration sensor chip; and
    a die pad which has a first area and a second area, and which also has an upper surface and a lower surface with the second area surrounding the first area and the pedestal part of the acceleration sensor chip being mounted on the second area.

2. The semiconductor acceleration sensor device according to claim 1 further comprising:
    a through hole which is formed from the upper surface of the first area of the die pad through the lower surface of the first area of the die pad.

3. The semiconductor acceleration sensor device according to claim 2 further comprising a lid part which completely covers the through hole formed in the die pad and which is coated with the second resin part.

4. The semiconductor acceleration sensor device according to claim 2 further comprising:
    a conductive part which has a first surface extending outwardly from the second resin part and which is disposed on a periphery of and spaced from the die pad; and
    a wire which electrically connects the stress detecting element and the conductive part.

5. The semiconductor acceleration sensor device according to claim 1 further comprising:
    a lid part attached to the acceleration sensor chip;
    a substrate having a conductive part extending outwardly from the second resin part, the acceleration sensor chip being connected to the substrate via the first resin part;
    a bump provided on the substrate and electrically connected to the acceleration sensor chip, the acceleration sensor chip being mounted on the bump.

6. The semiconductor acceleration sensor device according to claim 1 further comprising:
    a lid part attached to the acceleration sensor chip;
    a substrate having a conductive part extending outwardly from the second resin part;
    a semiconductor circuit chip electrically connected to the conductive part of the substrate and mounted on the substrate, the acceleration sensor chip being connected to the semiconductor circuit chip via the first resin part;
    a bump provided on the semiconductor circuit chip and electrically connected to the acceleration sensor chip, the acceleration sensor chip being mounted on the bump.

* * * * *